United States Patent [19]
Matsuo et al.

[11] Patent Number: 5,648,687
[45] Date of Patent: Jul. 15, 1997

[54] RESIN FOR SEALING COMPOUND SEMICONDUCTOR, SEMICONDUCTOR DEVICE, AND PROCESS FOR MANUFACTURING IT

[75] Inventors: Yoshihiko Matsuo, Kashiba; Kazuo Kusuda, Siki-gun; Naoki Sata, Kitakatsuragi-gun; Toshihumi Yoshikawa, Nara; Tsuneo Matsumura, Shiki-gun, all of Japan

[73] Assignee: Sharp Kabushiki Kaisha, Osaka, Japan

[21] Appl. No.: 207,165

[22] Filed: Mar. 8, 1994

[30] Foreign Application Priority Data

Apr. 30, 1993 [JP] Japan .................................. 5-104799

[51] Int. Cl.⁶ .................................................. H01L 23/28
[52] U.S. Cl. .................................... 257/787; 257/791
[58] Field of Search ................................ 257/787, 788, 257/791

[56] References Cited

U.S. PATENT DOCUMENTS

| | | |
|---|---|---|
| 3,904,583 | 9/1975 | Saunders et al. . |
| 4,278,784 | 7/1981 | Wong et al. . |
| 4,410,645 | 10/1983 | Das et al. . |
| 5,013,808 | 5/1991 | Piskoli . |
| 5,294,835 | 3/1994 | Igarashi et al. . |

FOREIGN PATENT DOCUMENTS 60-179419  9/1985  Japan .

*Primary Examiner*—Mahshid D. Saadat
*Assistant Examiner*—S. V. Clark
*Attorney, Agent, or Firm*—Nixon & Vanderhye P.C.

[57] ABSTRACT

A resin for sealing a compound semiconductor is here disclosed which contains, as a matrix, a siloxane compound for producing a silicone resin by addition reaction and which has a group comprising the bond of an organic group and an oxy group. The group comprising the bond of the organic group and the oxy group bonds to a terminal of the molecule of the siloxane compound, and as this group comprising the bond, 0.1 to 10% by weight, preferably 0.1 to 1.5% by weight of an alkoxy group (—OR') is used. A compound semiconductor chip is covered with the resin for sealing the compound semiconductor and then reacted under predetermined conditions to produce a silicone resin and simultaneously to chemically bond a siloxane group (—Si—O—) in the silicone resin to an element in a portion of the compound semiconductor chip which comes in contact with the silicone resin.

5 Claims, 9 Drawing Sheets

RESIN FOR SEALING COMPOUND SEMICONDUCTOR, SEMICONDUCTOR DEVICE, AND PROCESS FOR MANUFACTURING IT

BACKGROUND OF THE INVENTION

1. Field of the Invention

The present invention relates to a resin for sealing a compound semiconductor, a semiconductor device, and a process for manufacturing the semiconductor device. More specifically, it relates to a resin for sealing a compound semiconductor chip, a semiconductor device containing a compound semiconductor chip covered with a resin, and a process for manufacturing the semiconductor device.

2. Description of the Prior Art

Heretofore, as a resin for sealing a compound semiconductor, there has been used a resin (an addition reaction type silicone resin) obtained by adding an inorganic filler, a glass fiber or a curing catalyst to an addition reaction type siloxane compound (a compound having a —Si—O— bond) as a matrix. When this addition reaction type silicone resin is subjected to the addition reaction under predetermined curing conditions, a silicone resin (an organosiloxane polymer) having a siloxane bond as a main chain can be produced, as shown in FIG. 1. In this example, the addition reaction of the siloxane compounds (—O—R$_2$Si—CH—CH$_2$) and (H—R$_2$Si—O—) is carried out in the presence of a catalyst to produce the silicone resin (—O—R$_2$Si—CH$_2$CH$_2$—R$_2$Si—O—) (R is an organic group). The reasons why the addition reaction type silicone resin is used are that at the time of curing, solvent is not necessary and by-products are not formed to protect the compound semiconductor from contamination, and the curing can be completed in a short period of time by heating to contribute to the improvement of productivity. On the contrary, as for a resin containing a condensation reaction type siloxane compound as the matrix (a condensation reaction type silicone resin), an alcohol and water are generated at the time of the curing. Furthermore, the curing time of the condensation reaction type siloxane resin is relatively long, and the cured state of the resin is liable to change under the influence of the unevenness of temperature and moisture. For these reasons, the productivity is poor. In consequence, the condensation reaction type siloxane resin has not been used as the resin for sealing the compound semiconductor.

As described above, the addition reaction type silicone resin is excellent, but it still has some drawbacks. Even where a compound semiconductor chip, for example, a GaAlAs chip which functions as a luminous element is covered with the above-mentioned addition reaction type silicone resin and addition reaction is then carried out under predetermined curing conditions, the luminous output and withstand voltage (a reverse withstand voltage) decline and the characteristics of the chip also deteriorate, when the chip is continuously used.

SUMMARY OF THE INVENTION

Under such circumstances, an object of the present invention is to provide a resin for sealing a compound semiconductor which can prevent characteristics of a compound semiconductor chip from deteriorating.

Another object of the present invention is to provide a semiconductor device which contains a compound semiconductor chip covered with a silicone resin and which can prevent characteristics of the compound semiconductor chip from deteriorating.

Still another object of the present invention is to provide a process for manufacturing the above-mentioned semiconductor device.

The present invention intends to achieve the above-mentioned objects, and the first aspect of the present invention is directed to a resin for sealing a compound semiconductor which contains, as a matrix, a siloxane compound for producing a silicone resin by addition reaction and which has a group comprising the bond of an organic group and an oxy group.

The second aspect of the present invention is directed to the resin for sealing a compound semiconductor according to the first aspect wherein said group comprising the bond of the organic group and the oxy group bonds to a terminal of the molecule of the siloxane compound.

The third aspect of the present invention is directed to the resin for sealing a compound semiconductor according to the second aspect wherein said group comprising the bond of the organic group and the oxy group is an alkoxy group.

The fourth aspect of the present invention is directed to the resin for sealing a compound semiconductor according to the third aspect wherein the content of the alkoxy group is in the range of from 0.1 to 10% by weight.

The fifth aspect of the present invention is directed to the resin for sealing a compound semiconductor according to the fourth aspect wherein the content of the alkoxy group is in the range of from 0.1 to 1.5% by weight.

The sixth aspect of the present invention is directed to a semiconductor device containing a compound semiconductor chip in which the compound semiconductor chip is covered with a silicone resin, and an element in a portion of the compound semiconductor chip which comes in contact with the silicone resin chemically bonds to a siloxane group of the silicone resin.

The seventh aspect of the present invention is directed to the semiconductor device according to the sixth aspect wherein the compound semiconductor chip contains GaAlAs at least in a portion, and Al of this GaAlAs portion bonds to the siloxane group of the silicone resin.

The eighth aspect of the present invention is directed to a process for manufacturing a semiconductor device containing a compound semiconductor chip which comprises the steps of covering the compound semiconductor chip with a resin for sealing a compound semiconductor in which a siloxane compound for producing a silicone resin by addition reaction is a matrix and which contains 0.1 to 10% by weight of an alkoxy group as a group comprising the bond of an organic group and an oxy group and bonding to a terminal of the molecule of the siloxane compound; and then reacting the resin for sealing the compound semiconductor to produce a silicone resin and to bond chemically a siloxane group of the silicone resin to an element in a portion of the compound semiconductor chip which comes in contact with the silicone resin.

For example, in the case of a GaAlAs chip which functions as a luminous element, Al is active and an unstable factor. That is, this Al usually bonds to a hydroxyl group (—OH) in the air, but it takes various states under the influence of circumstances in which the chip is used. As a result, characteristics of the chip are affected and deteriorated. Thus, the present inventors has tried to add a group (—OR) comprising the bond of an organic group and an oxy group to an addition reaction type silicone resin (a resin for sealing a compound semiconductor in which a siloxane compound for producing a silicone resin by addition reaction is a matrix). In this case, a hydroxyl group (—OH)

bonding to the active element of a compound semiconductor chip is reacted with the group (—OR) comprising the bond of the organic group and the oxy group, so that a compound (R—OH) comprising the organic group and the hydroxyl group is eliminated and simultaneously the active element of the compound semiconductor chip chemically bonds to a siloxane group (—Si—O—) in the silicone resin produced by the addition reaction. Therefore, a portion of the compound semiconductor chip which comes in contact with the silicone resin becomes a chemically stable state, whereby characteristics of the compound semiconductor chip are prevented from deteriorating. Even in the cases that other various chemical bonds are taken in addition to the above-mentioned bond of Al and the hydroxyl group, a similar function is considered to be possible.

When the group (—OR) comprising the bond of the organic group and the oxy group bonds to a terminal of the molecule of the siloxane compound, this group (—OR) easily reacts with the hydroxyl group (—OH) bonding to the active element of the compound semiconductor chip. As a result, the portion of the compound semiconductor chip which comes in contact with the silicone resin becomes a chemically stable state, whereby characteristics of the compound semiconductor chip are prevented from deteriorating. In the above-mentioned example, the hydroxyl group is utilized, but even in the cases that other various chemical bonds are taken in addition to the bond of the hydroxyl group, a similar function is considered to be possible.

When the group comprising the bond of the organic group and the oxy group is an alkoxy group (—OR'), this group easily reacts with the hydroxyl group (—OH) bonding to the active element of the compound semiconductor chip (R' is an alkyl group). That is, the above-mentioned alkoxy group (—OR') reacts with the hydroxyl group (—OH), so that an alcohol (R'OH) is eliminated and simultaneously the active element in the compound semiconductor chip chemically bonds to the siloxane group (—Si—O—) in the silicone resin produced by the addition reaction. As a result, the portion of the compound semiconductor chip which comes in contact with the silicone resin becomes a chemically stable state, whereby characteristics of the compound semiconductor chip are prevented from deteriorating. In this case, the amount of the eliminated alcohol (R'OH) is so small that the characteristics of the compound semiconductor chip are scarcely affected thereby.

Preferably, the addition reaction type silicone resin contains 0.1% by weight or more of the above-mentioned alkoxy group (—OR') in order to completely react the hydroxyl group (—OH) in the portion of the compound semiconductor chip which comes in contact with the silicone resin (which will be described in detail hereinafter). If the content of the alkoxy group (—OR') is too high, a problem such as hygroscopicity or viscosity of the addition reaction type silicone resin will rise. The upper limit of the content of the alkoxy group is to be determined in view of this viewpoint.

Furthermore, in the semiconductor device of the present invention, the compound semiconductor chip is covered with the silicone resin, and an element in the portion of the compound semiconductor chip which comes in contact with the silicone resin chemically bonds to the siloxane group (—Si—O—) in the silicone resin. Therefore, as described above, the portion of the compound semiconductor chip which comes in contact with the silicone resin becomes a chemically stable state, whereby characteristics of the compound semiconductor chip are prevented from deteriorating.

In the case that the above-mentioned compound semiconductor chip contains GaAlAs at least locally and Al of this GaAlAs portion bonds to the siloxane group (—Si—O—) of the silicone resin, this Al reaches a chemically stable state, and as a result, characteristics of the compound semiconductor chip are prevented from deteriorating.

According to the process for manufacturing the semiconductor device of the present invention, an element in the portion of the compound semiconductor chip contained in the semiconductor device which comes in contact with the silicone resin chemically bonds to the siloxane group (—Si—O—) in the silicone resin. Therefore, the portion of the compound semiconductor chip which comes in contact with the silicone resin reaches a chemically stable state, whereby characteristics of the compound semiconductor chip are prevented from deteriorating.

DESCRIPTION OF THE PREFERRED EMBODIMENTS

Next, the present invention will be described in detail in reference to examples.

Initially, reference will be made to an example where a GaAlAs chip functioning as a luminous element is sealed with a resin for sealing a compound semiconductor which is one embodiment of the present invention.

In this example, as the resin for sealing the compound semiconductor, a resin was prepared by adding an alkoxy group (—OR') as a group comprising the bond of an organic group and an oxy group to a matrix comprising an addition reaction type siloxane compound (a compound having a —Si—O— bond) in a predetermined ratio. The above-mentioned matrix was a mixture of siloxane compounds (—O—$R_2$Si—CH—$CH_2$) and (H—$R_2$Si—O—) shown in FIG. 1. The above-mentioned alkoxy group (—OR') was combined with a terminal of the molecule of the siloxane compound so as to be (—O—$R_2$Si—OR'), as shown in FIG. 2. A typical example of this alkoxy group is a methoxy group (—$OCH_3$), but an ethoxy group (—$OC_2H_5$) and a phenoxy group are also usable. In addition, an inorganic filler, a glass fiber, a curing catalyst and the like can be added to the mixture, as in a conventional case.

Figure 1:
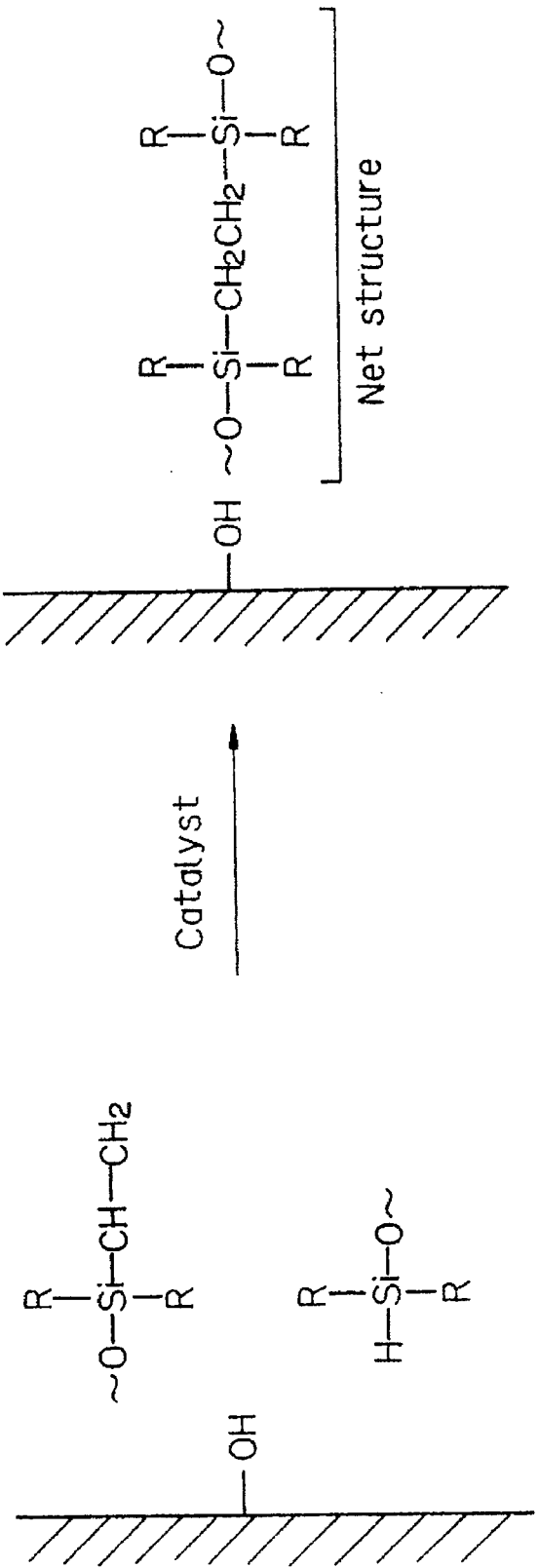
FIG. 1 shows the composition and reaction of a conventional resin for sealing a compound semiconductor.
Figure 2:
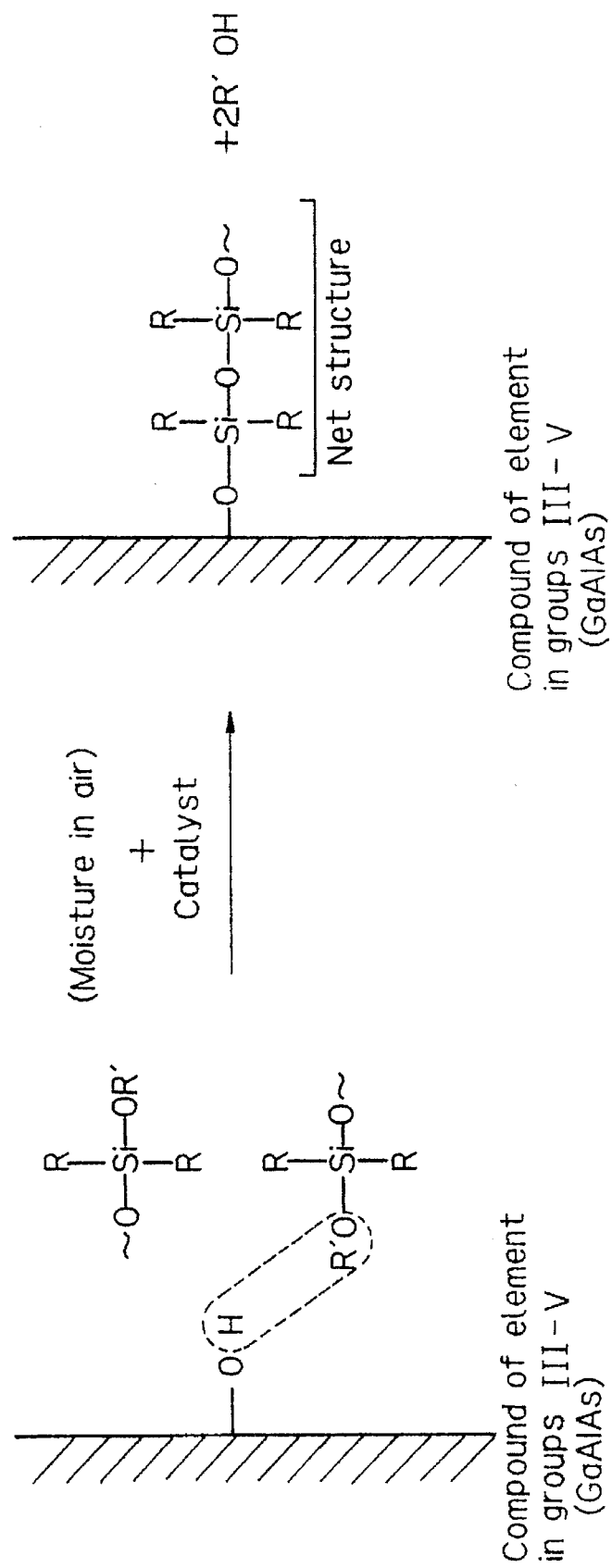
FIG. 2 shows one embodiment of the composition and reaction of a resin for sealing a compound semiconductor of the present invention.

After a GaAlAs chip was covered with the resin for sealing the compound semiconductor, this resin was cured under predetermined conditions, for example, by heating the resin for 1 to 2 hours in an oven set to a temperature in the range of from 100° to 260° C., whereby the siloxane compounds (—O—$R_2$Si—CH—$CH_2$) and (H—$R_2$Si—O—) were subjected to addition reaction in the presence of the catalyst as shown in FIG. 1 to produce a silicone resin (—O—$R_2$Si—$CH_2CH_2$—$R_2$Si—O—). Simultaneously, the siloxane compound (—O—$R_2$Si—OR') having an alkoxy group was mutually reacted in a portion where the resin came in contact with the GaAlAs chip, thereby producing a silicone resin (—O—$R_2$Si—O—$R_2$Si—O—), as shown in FIG. 2. At this time, the alkoxy group (—OR') was easily reacted with a hydroxyl group (—OH) beforehand combined with the active element Al of the GaAlAs chip. That is, the alkoxy group (—OR') was reacted with the hydroxyl group (—OH), so that an alcohol (R'OH) was eliminated and the active element Al of the GaAlAs chip was chemically bonded to a siloxane group (—Si—O—) in the silicone resin produced by the addition reaction. In consequence, the portion of the compound semiconductor chip which came in contact with the silicone resin became a chemically stable state, whereby characteristics of the compound semiconductor chip were prevented from deteriorating. In this case, the amount of the eliminated alcohol (R'OH) is so small that the characteristics of the compound semiconductor chip are scarcely affected thereby.

Figure 3:
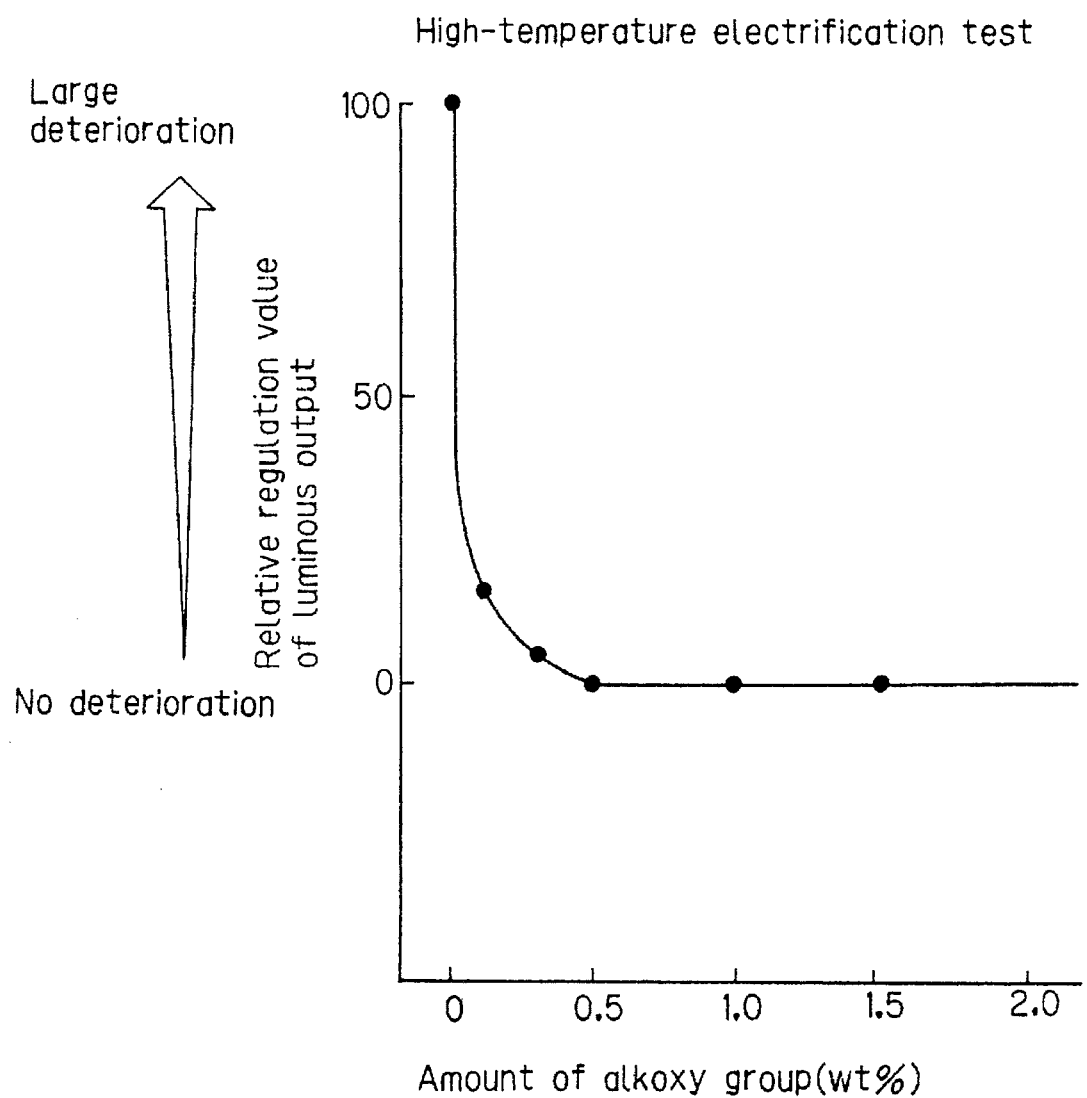
FIG. 3 shows a regulation of the luminous output of a GaAlAs chip to which the resin for sealing the compound semiconductor of the present invention is applied in a high-temperature electrification test.
Figure 4:
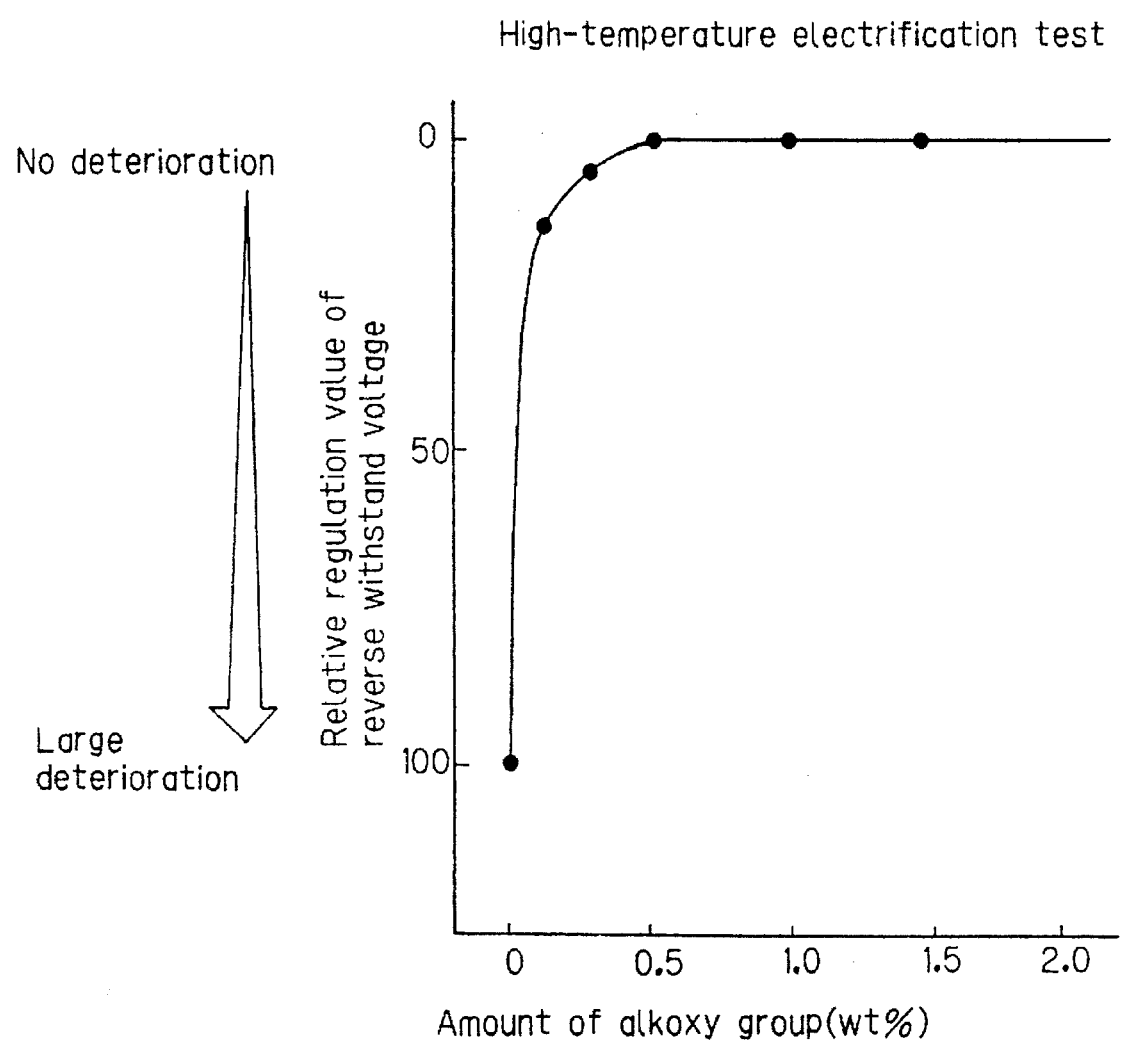
FIG. 4 shows a regulation of the reverse withstand voltage of a GaAlAs chip to which the resin for sealing the compound semiconductor of the present invention is applied in the high-temperature electrification test.

In a high-temperature electrification test, the deterioration of the characteristics of the GaAlAs chip (the luminous element) was measured, actually changing the content of the alkoxy group (—OR') in the resin for sealing the compound semiconductor, and the results are shown in FIGS. 3 and 4. FIGS. 3 and 4 show the regulation of a luminous output and that of a reverse withstand voltage in terms of relative values, respectively, and in this case, the regulation at the time of no alkoxy group (a conventional product) was regarded as 100. As is apparent from FIG. 3, the regulation of the luminous output decreases along with the increase of the amount of the alkoxy group to be added, and when the amount of the alkoxy group is 0.1% by weight or more, the regulation is substantially zero. Furthermore, as is apparent from FIG. 4, the regulation of the reverse withstand voltage also decreases along with the increase of the amount of the alkoxy group to be added, and when the amount of the alkoxy group is 0.1% by weight or more, the regulation is substantially zero. From these results, it has been understood that the surface of the GaAlAs chip can be substantially completely stabilized by adding 0.1% by weight or more of the alkoxy group, whereby the characteristics of the GaAlAs chip can be inhibited from deteriorating. In this case, as is apparent from the above-mentioned drawings, the addition effect of the alkoxy group gets at the ceiling when its content is 10% by weight based on the weight of the resin. In addition, if the amount of the alkoxy group (—OR') is too large, a problem such as hygroscopicity, viscosity or the shape of a cured coating of the resin for sealing the compound semiconductor rather rises. The upper limit of the amount of the alkoxy group to be added is to be determined in view of this viewpoint. Therefore, the content of the alkoxy group is preferably in the range of from 0.1 to 10% by weight, more preferably from 0.1 to 1.5% by weight.

The above-mentioned example is concerned with the technique of sealing the GaAlAs chip (the luminous element), but needless to say, the present invention is not limited to this example. The resin for sealing the compound semiconductor of the present invention can be widely applied to semiconductor devices containing semiconductor chips of compounds of elements in the groups III to V of the Periodic Table, in addition to the above-mentioned GaAlAs chip. Moreover, the resin can also be applied to devices containing chips and the like comprising compound semiconductors of elements in the groups II to VI of the Periodic Table.

Figure 5:
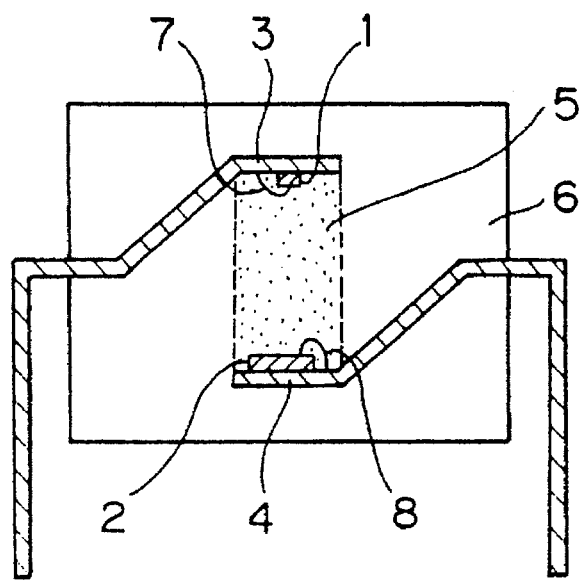
FIG. 5 shows a photo coupler to which the resin for sealing the compound semiconductor of the present invention is applied.

FIG. 5 to FIGS. 9A to 9C show semiconductor devices to which the resin for sealing the compound semiconductor is applied. FIG. 5 shows a photo coupler. In this photo coupler, a compound semiconductor luminous chip 1 and a light receiving chip 2 are mounted on lead frames 3, 4 so that they may be faced to each other, and the resin for sealing the compound semiconductor is interposed between the compound semiconductor luminous chip 1 and the light receiving chip 2. Next, this resin for sealing the compound semiconductor is heated to cure the same, thereby producing a silicone resin 5. Afterward, a shading resin 6 was molded to as to surround them. Reference numerals 7 and 8 denote Au wires. In this photo coupler, the compound semiconductor luminous chip 1 is covered with the silicone resin 5, and an element in a portion of the compound semiconductor chip 1 which comes in contact with the silicone resin 5 chemically bonds to a siloxane group (—Si—O—) in the silicone resin 5. Therefore, as described above, the portion of the compound semiconductor chip 1 which comes in contact with the silicone resin 5 can be chemically stabilized, whereby characteristics of the compound semiconductor luminous chip 1 can be prevented from deteriorating.

Figure 6:
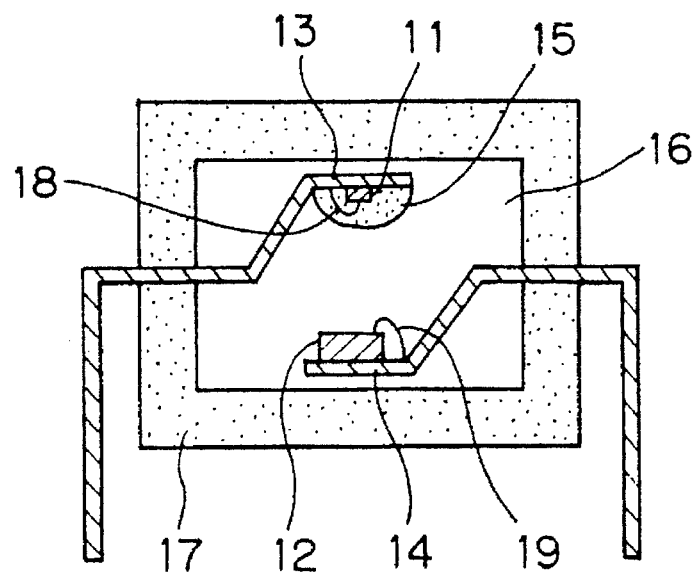
FIG. 6 shows another photo coupler to which the resin for sealing the compound semiconductor of the present invention is applied.

FIG. 6 shows another photo coupler. In this photo coupler, a compound semiconductor luminous chip 11 is mounted on a lead frame 13 and then covered with the resin for sealing the compound semiconductor. Next, this resin for sealing the compound semiconductor is heated to cure the same, thereby producing a silicone resin 15. Afterward, a light receiving chip 12 is mounted on a lead frame 14 so as to face to the compound semiconductor luminous chip 11, and a transmittable resin 16 and a shading resin 17 were molded in this order to as to surround them. Reference numerals 18 and 19 denote Au wires. In this photo coupler, the compound semiconductor luminous chip 11 is covered with the silicone resin 15, and an element in a portion of the compound semiconductor chip 11 which comes in contact with the silicone resin 15 chemically bonds to a siloxane group (—Si—O—) in the silicone resin 15. Therefore, the portion of the compound semiconductor chip 11 which comes in contact with the silicone resin 15 can be chemically stabilized, whereby characteristics of the compound semiconductor luminous chip 11 can be prevented from deteriorating.

Figure 7:
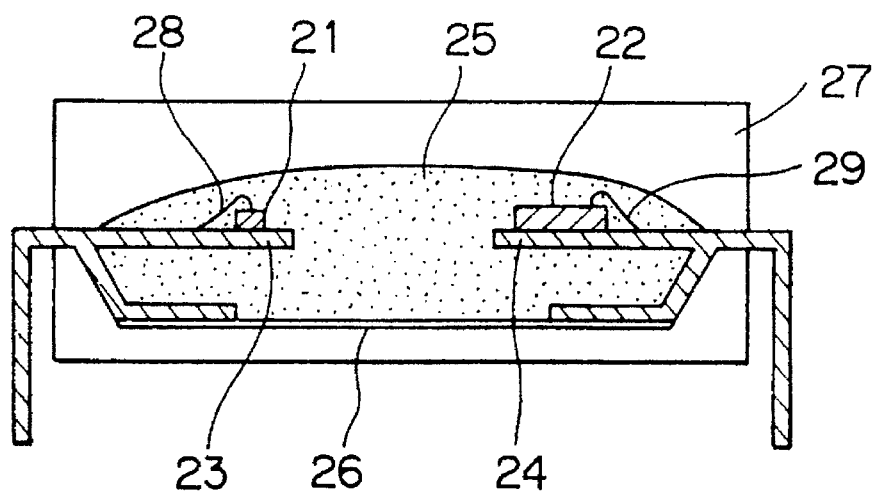
FIG. 7 shows still another photo coupler to which the resin for sealing the compound semiconductor of the present invention is applied.

FIG. 7 shows still another photo coupler. In this photo coupler, a compound semiconductor luminous chip 21 and a light receiving chip 22 are mounted on lead frames 23, 24, respectively. These frames are arranged via an insulating sheet 26 so as to be on one surface, and the resin for sealing the compound semiconductor is then deposited so as to wrap the compound semiconductor luminous chip 21 and the light receiving chip 22. Next, this resin for sealing the compound semiconductor is heated to cure the same, thereby producing a silicone resin 25. Afterward, a shading resin 27 was molded to as to surround them. Reference numerals 28 and 29 denote Au wires. In this photo coupler, the compound semiconductor luminous chip 21 is covered with the silicone resin 25, and an element in a portion of the compound semiconductor chip 21 which comes in contact with the silicone resin 25 chemically bonds to a siloxane group (—Si—O—) in the silicone resin 5. Therefore, the portion of the compound semiconductor chip 21 which comes in contact with the silicone resin 25 can be chemically stabilized, whereby characteristics of the compound semiconductor luminous chip 21 can be prevented from deteriorating.

Figure 8:
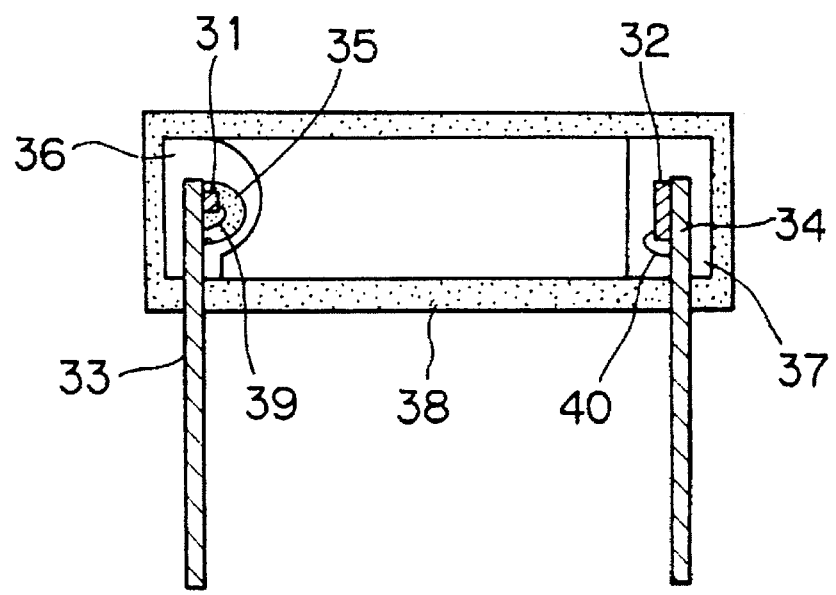
FIG. 8 shows a further photo coupler to which the resin for sealing the compound semiconductor of the present invention is applied.

FIG. 8 shows a further photo coupler. In this photo coupler, a compound semiconductor luminous chip 31 is mounted on a lead frame 33 and then covered with the resin for sealing the compound semiconductor. Next, this resin for sealing the compound semiconductor is heated to cure the same, thereby producing a silicone resin 35. Afterward, the compound semiconductor luminous chip 31 covered with the silicone resin 35 and a light receiving chip 32 mounted on a lead frame 34 are arranged so as to face each other and then sealed with transmittable resin 36, 37, and they are further wrapped with a shading resin 38. Reference numerals 39 and 40 denote Au wires. In this photo coupler, the compound semiconductor luminous chip 31 is covered with the silicone resin 35, and an element in a portion of the compound semiconductor chip 31 which comes in contact with the silicone resin 35 chemically bonds to a siloxane group (—Si—O—) in the silicone resin 35. Therefore, the portion of the compound semiconductor chip 31 which comes in contact with the silicone resin 35 can be chemically stabilized, whereby characteristics of the compound semiconductor luminous chip 31 can be prevented from deteriorating.

Figure 9B:
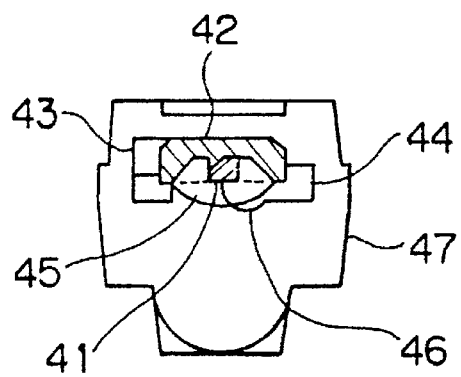
FIG. 9B shows a section along the line 48a–48b of the stand-alone luminous element in FIG. 9A.
Figure 9A:
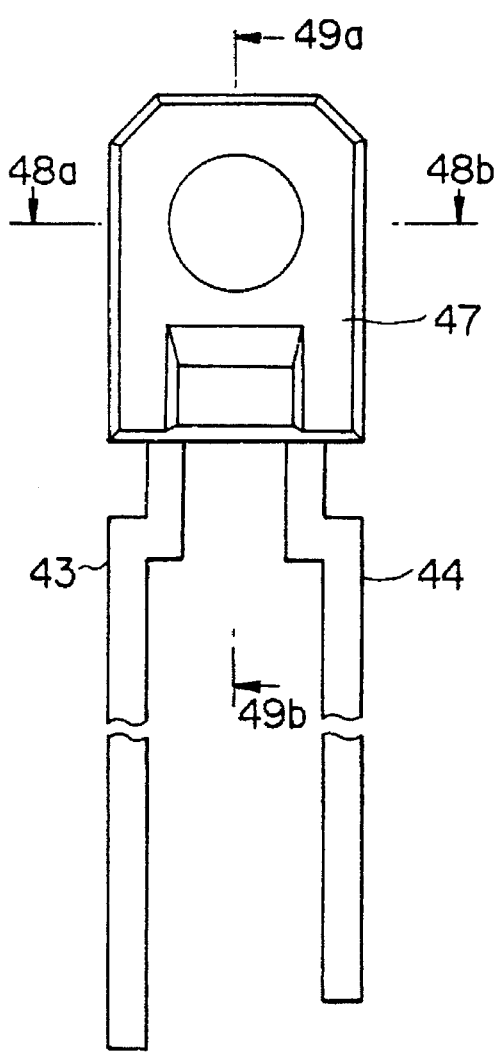
FIG. 9A shows a stand-alone luminous element to which the resin for sealing the compound semiconductor of the present invention is applied.
Figure 9C:
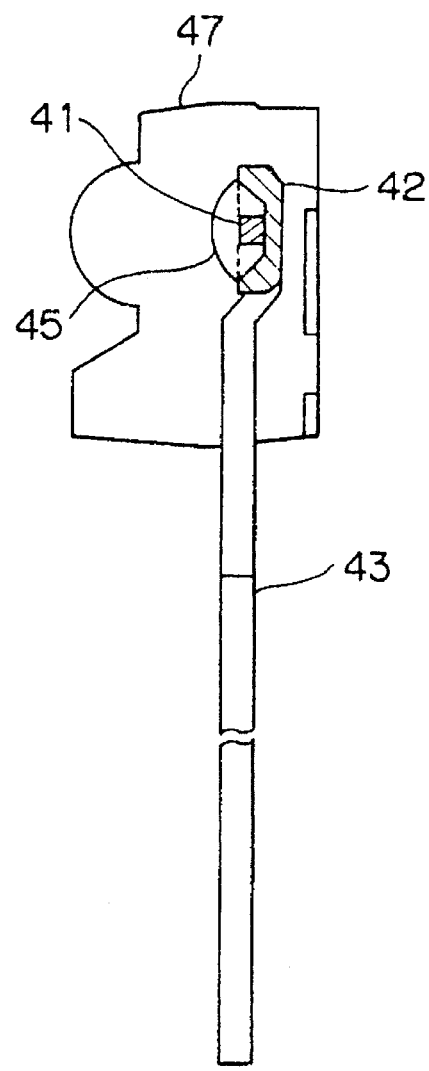
FIG. 9C shows a section along the line 49a–49b of the stand-alone luminous element in FIG. 9A.

FIGS. 9A, 9B and 9C show a stand-alone luminous element. FIGS. 9B and 9C show a section along the line 48a–48b and a section along the line 49a–49b in FIG. 9A, respectively. In this stand-alone luminous element, a compound semiconductor luminous chip 41 is mounted on a header portion 42 of a lead frame 43 and then connected to a lead frame 44 via an Au wire 46. Afterward, the compound semiconductor luminous chip 41 is covered with the resin for sealing the compound semiconductor, and this resin for sealing the compound semiconductor is heated to cure the same, thereby producing a silicone resin 45. Afterward, a transmittable resin 47 was molded so as to surround them. In this stand-alone luminous element, the compound semiconductor luminous chip 41 is covered with the silicone resin 45, and an element in a portion of the compound semiconductor chip 41 which comes in contact with the silicone resin 45 chemically bonds to a siloxane group (—Si—O—) in the silicone resin 45. Therefore, as described above, the portion of the compound semiconductor chip 41 which comes in contact with the silicone resin 45 can be chemically stabilized, whereby characteristics of the compound semiconductor luminous chip 41 can be prevented from deteriorating.

Figure 10:
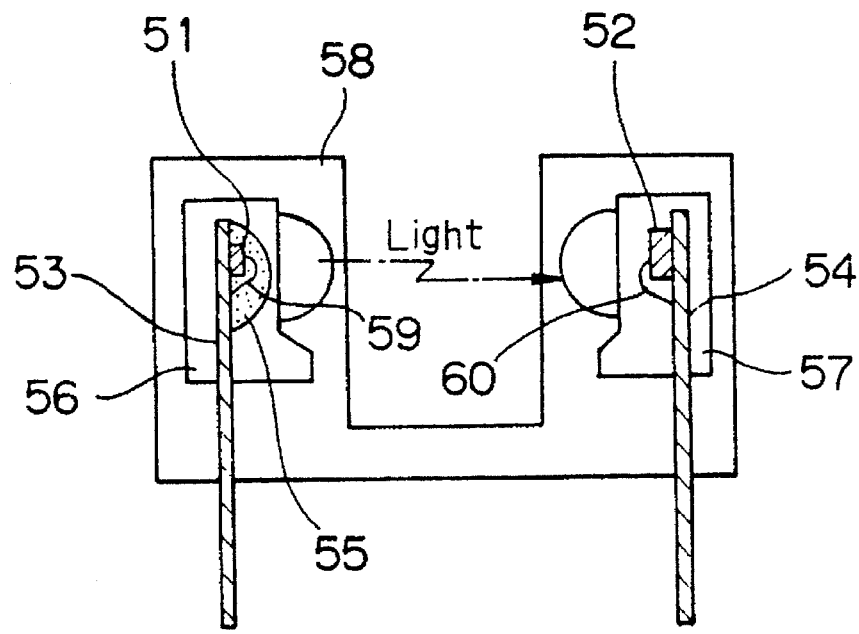
FIG. 10 shows a transmittable photointerrupter to which the resin for sealing the compound semiconductor of the present invention is applied.
Figure 11:
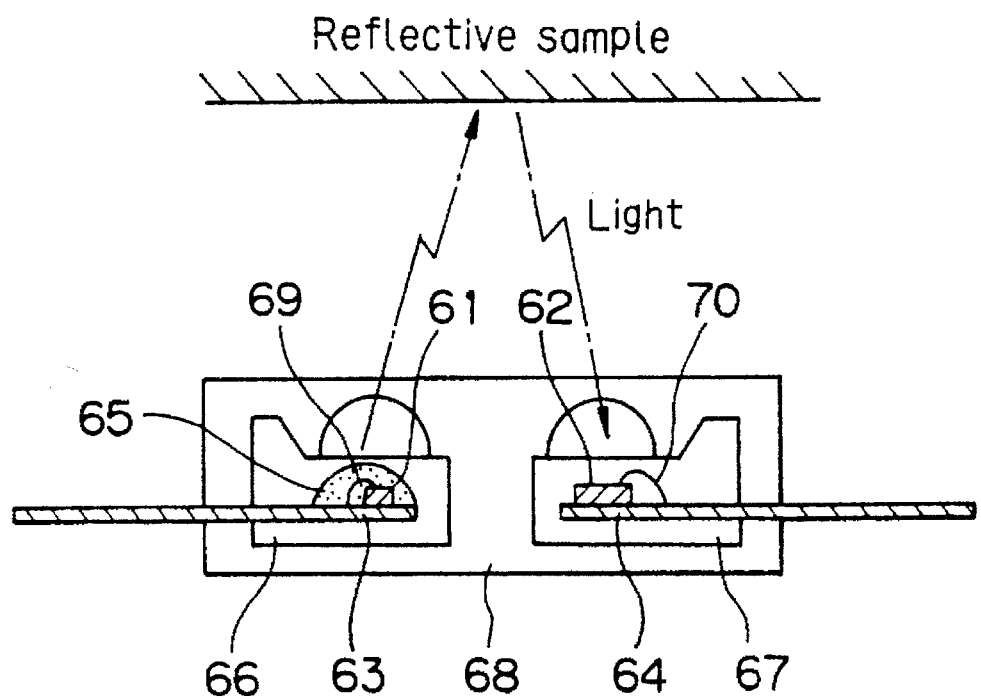
FIG. 11 shows a reflective photointerrupter to which the resin for sealing the compound semiconductor of the present invention is applied.
Figure 12:
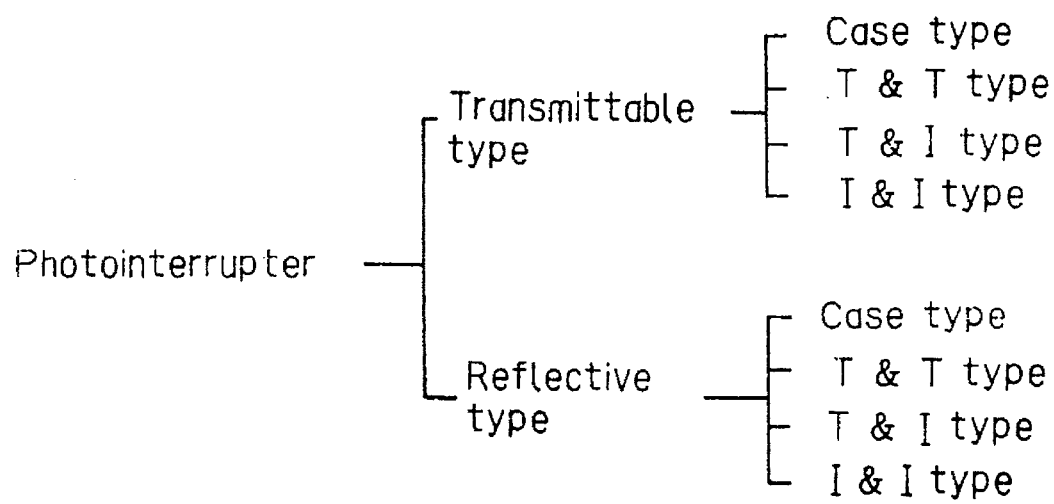
FIG. 12 shows the classification of the photointerrupters.

FIG. 10 and FIG. 11 show a transmittable photointerrupter and a reflective photointerrupter, respectively. In the transmittable photointerrupter shown in FIG. 10, a compound semiconductor luminous chip 51 and a light receiving chip 52 are attached to lead frames 53, 54, respectively, so as to face to each other. On the other hand, in the reflective photointerrupter shown in FIG. 11, a compound semiconductor luminous chip 61 and a light receiving chip 62 are attached to lead frames 63, 64, respectively, so as to be on one surface. Reference numerals 59, 60, 69 and 70 denote Au wires. The transmittable photointerrupter and the reflective photointerrupter can be classified into a case type, a T & T type, a T & I type and an I & I type, as shown in FIG. 12. Taking the transmittable photointerrupter in FIG. 10 as an example, the case type is the photointerrupter which can be prepared by forming a luminous element and a light receiving element (which are both in the molded resins 56, 57) from the compound semiconductor luminous chip 51 and the light receiving chip 52, respectively, by the same procedure as in the stand-alone luminous element shown in FIGS. 9A to 9C, and then incorporating them in an outer case 58 or 68. The T & T type is the photointerrupter which can be prepared by transfer-molding the luminous element and the light receiving element, and similarly transfer-molding the outer case 58 or 68. The T & I type is the photointerrupter which can be prepared by transfer-molding the luminous element and the light receiving element, and injection-molding the outer case 58 or 68. The I & I type is the photointerrupter which can be prepared by injection-molding the luminous element and the light receiving element, and similarly injection-molding the outer case 58 or 68. The reflective photointerrupter in FIG. 11 can also be classified into the respective types in all the same manner as in the transmittable photointerrupter. In any case, in manufacturing the photointerrupter, the compound semiconductor luminous chip 51 or 61 is first mounted on the lead frame 53 or 63, and they are connected to each other via the Au wire 59 or 69. Afterward, the compound semiconductor luminous chip 51 or 61 is covered with the resin for sealing the compound semiconductor. Next, this resin for sealing the compound semiconductor is heated to cure the same, thereby producing a silicone resin 55 or 65. In this case, the compound semiconductor luminous chip 51 or 61 is covered with the silicone resin 55 or 65, and an element in a portion of the compound semiconductor chip 51 or 61 which comes in contact with the silicone resin 55 or 65 chemically bonds to a siloxane group (—Si—O—) in the silicone resin 55 or 65. Therefore, the portion of the compound semiconductor chip 51 or 61 which comes in contact with the silicone resin 55 or 65 can be chemically stabilized, whereby characteristics of the compound semiconductor luminous chip 51 or 61 can be prevented from deteriorating.

As is apparent from the foregoing, a resin for sealing a compound semiconductor of the present invention is a resin for sealing a compound semiconductor in which a siloxane compound for producing a silicone resin by addition reaction is a matrix and which contains a group comprising the bond of an organic group and an oxy group. Therefore, at the time of curing, a hydroxyl group (—OH) bonded to an active element of a compound semiconductor chip is reacted with the group (—OR) comprising the bond of the organic group and the oxy group, so that a compound (R—OH) comprising the organic group and the hydroxyl group is eliminated and the active element of the compound semiconductor chip can be chemically bonded to a siloxane group (—Si—O—) in the silicone resin produced by the addition reaction. In consequence, the portion of the compound semiconductor chip which comes in contact with the silicone resin can be chemically stabilized, whereby characteristics of the compound semiconductor luminous chip can be prevented from deteriorating.

When the group (—OR) comprising the bond of the organic group and the oxy group bonds to a terminal of the molecule of the siloxane compound, this group (—OR) easily reacts with the hydroxyl group (—OH) bonding to the active element of the compound semiconductor chip. As a result, the portion of the compound semiconductor chip which comes in contact with the silicone resin can be chemically stabilized, whereby the characteristics of the compound semiconductor chip can be prevented from deteriorating.

When the group comprising the bond of the organic group and the oxy group is an alkoxy group (—OR'), this group easily reacts with the hydroxyl group (—OH) bonding to the active element of the compound semiconductor chip (R' is an alkyl group). That is, the above-mentioned alkoxy group (—OR') reacts with the hydroxyl group (—OH), so that an alcohol (R'OH) is eliminated and simultaneously the active element in the compound semiconductor chip chemically bonds to the siloxane group (—Si—O—) in the silicone resin produced by the addition reaction. Accordingly, the portion of the compound semiconductor chip which comes in contact with the silicone resin can be chemically stabilized, whereby the characteristics of the compound semiconductor chip can be prevented from deteriorating.

When the resin for sealing the compound semiconductor contains 0.1 to 10% by weight, preferably 0.1 to 1.5% by weight of the above-mentioned alkoxy group (—OR'), the hydroxyl group (—OH) in the portion of the compound semiconductor chip which comes in contact with the silicone resin can be substantially completely reacted. Accordingly, the characteristics of the compound semiconductor chip can be effectively prevented from deteriorating.

Furthermore, in a semiconductor device of the present invention, the compound semiconductor chip covered with the silicone resin, and an element in a portion of the compound semiconductor chip which comes in contact with the silicone resin chemically bonds to a siloxane group (—Si—O—) in the silicone resin. Therefore, the portion of the compound semiconductor chip which comes in contact with the silicone resin can be chemically stabilized, whereby the characteristics of the compound semiconductor luminous chip can be prevented from deteriorating.

In the case that the above-mentioned compound semiconductor chip contains GaAlAs at least locally and Al of this GaAlAs portion bonds to the siloxane group (—Si—O—) of the silicone resin, this Al becomes a chemically stable state, and as a result, the characteristics of the compound semiconductor chip can be prevented from deteriorating.

According to a process for manufacturing the semiconductor device of the present invention, an element in the portion of the compound semiconductor chip contained in the semiconductor device which comes in contact with the silicone resin chemically bonds to the siloxane group (—Si—O—) in the silicone resin. Therefore, the portion of the compound semiconductor chip which comes in contact with the silicone resin can be chemically stabilized, whereby the characteristics of the compound semiconductor chip are prevented from deteriorating.

What is claimed is:

1. A resin for sealing a compound semiconductor which contains, as a matrix, a siloxane compound for producing a silicone resin by addition reaction and which has a group comprising the bond of an organic group and an oxy group, wherein said group comprising the bond of the organic group and the oxy group is an alkoxy group bonding to a terminal of the molecule of the siloxane compound, and the content of said alkoxy group is in the range of from 0.1 to 10% by weight.

2. The resin for sealing a compound semiconductor according to claim 1 wherein the content of said alkoxy group is preferably in the range of from 0.1 to 1.5% by weight.

3. A semiconductor device containing a compound semiconductor chip in which the compound semiconductor chip is covered with a silicone resin, and an element in a portion of the compound semiconductor chip which comes in contact with the silicone resin chemically bonds to a siloxane group of the silicone resin, and wherein said compound semiconductor chip contains GaAlAs at least locally, and Al of this GaAlAs portion bonds to the siloxane group of the silicone resin.

4. A semiconductor device comprising a compound semiconductor chip covered with a sealing resin, said resin including a siloxane compound for producing a silicone resin by addition reaction and having 0.1 to 10% by weight of an alkoxy group forming the bond of an organic group and an oxy group bonding to a terminal of the molecule of the siloxane compound, and said silicone resin chemically bonding a siloxane group of the silicone resin to an element in the compound semiconductor chip in contact with the silicone resin.

5. A semiconductor device as in claim 4 wherein the element is Al.

* * * * *